(12) United States Patent
Rendek, Jr. et al.

(10) Patent No.: US 9,059,317 B2
(45) Date of Patent: Jun. 16, 2015

(54) METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES

(71) Applicant: HARRIS CORPORATION, Melbourne, FL (US)

(72) Inventors: Louis Joseph Rendek, Jr., Melbourne, FL (US); Michael Raymond Weatherspoon, West Melbourne, FL (US); Casey Philip Rodriguez, Indialantic, FL (US); David Nicol, Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

(21) Appl. No.: 14/162,959

(22) Filed: Jan. 24, 2014

(65) Prior Publication Data
US 2014/0138849 A1  May 22, 2014

Related U.S. Application Data

(62) Division of application No. 13/007,035, filed on Jan. 14, 2011, now Pat. No. 8,693,203.

(51) Int. Cl.
*H01L 23/00* (2006.01)
*H01L 23/498* (2006.01)
(Continued)

(52) U.S. Cl.
CPC ........... *H01L 24/83* (2013.01); *Y10T 29/49156* (2015.01); *Y10T 428/24917* (2015.01);
(Continued)

(58) Field of Classification Search
CPC ......... H01L 24/83; H01L 24/33; H01L 24/94; H01L 25/0657; H01L 23/3157; H01L 23/49894; H01L 24/16; H01L 24/13; H01L 23/49822; H05K 3/3452; H05K 3/3436
See application file for complete search history.

(56) References Cited

U.S. PATENT DOCUMENTS 5,126,192 A  6/1992  Chellis et al.
5,449,591 A  9/1995  Sato et al.
(Continued)

FOREIGN PATENT DOCUMENTS

EP  1215948  6/2002
EP  2001274  12/2008
(Continued)

OTHER PUBLICATIONS

Culbertson, "A New Laminate Material for High Performance PCBs: Liquid Crystal Polymer Copper Clad Films", IEEE, 1995, pp. 520-523.
(Continued)

*Primary Examiner* — William Coleman
(74) *Attorney, Agent, or Firm* — Allen, Dyer, Doppelt, Milbrath & Gilchrist, P.A.

(57) ABSTRACT

A method for making an electronic device includes forming an interconnect layer stack on a rigid wafer substrate having a plurality of patterned electrical conductor layers, a dielectric layer between adjacent patterned electrical conductor layers, and at least one solder pad on an uppermost patterned electrical conductor layer. An LCP solder mask having at least one aperture therein alignable with the at least one solder pad is formed. The LCP solder mask and interconnect layer stack are aligned and laminated together. Solder is positioned in the at least one aperture. At least one circuit component is attached to the at least one solder pad using the solder.

22 Claims, 4 Drawing Sheets

(51) Int. Cl.
*H01L 23/31* (2006.01)
*H01L 25/065* (2006.01)
*H05K 1/03* (2006.01)
*H05K 3/28* (2006.01)
*H05K 3/34* (2006.01)

(52) U.S. Cl.
CPC .......... *Y10T29/49144* (2015.01); *Y10T 428/25* (2015.01); *Y10T 29/49165* (2015.01); *H01L 23/49894* (2013.01); *H05K 1/0306* (2013.01); *H05K 3/281* (2013.01); *H05K 3/3436* (2013.01); *H05K 3/3452* (2013.01); *H05K 2201/0141* (2013.01); *H05K 2201/10674* (2013.01); *H05K 2203/063* (2013.01); *H01L 2224/11422* (2013.01); *H01L 23/3157* (2013.01); *H01L 23/49822* (2013.01); *H01L 24/11* (2013.01); *H01L 24/13* (2013.01); *H01L 24/16* (2013.01); *H01L 24/81* (2013.01); *H01L 24/94* (2013.01); *H01L 25/0657* (2013.01); *H01L 2224/05647* (2013.01); *H01L 2224/1148* (2013.01); *H01L 2224/13021* (2013.01); *H01L 2224/81191* (2013.01); *H01L 2224/81815* (2013.01); *H01L 2224/94* (2013.01); *H01L 2225/06513* (2013.01); *H01L 2225/06568* (2013.01); *H01L 2224/131* (2013.01); *H01L 2224/16145* (2013.01); *H01L 2924/00013* (2013.01); *H01L 2924/01029* (2013.01); *H01L 2224/16237* (2013.01); *H01L 2924/01327* (2013.01); *H01L 24/33* (2013.01); *H01L 2224/0401* (2013.01)

(56) References Cited

U.S. PATENT DOCUMENTS

| | | | |
|---|---|---|---|
| 5,534,094 | A | 7/1996 | Arjavalingam et al. |
| 5,615,477 | A | 4/1997 | Sweitzer |
| 5,633,072 | A | 5/1997 | Middelman et al. |
| 6,121,553 | A | 9/2000 | Shinada et al. |
| 6,183,588 | B1 | 2/2001 | Kelly et al. |
| 6,207,077 | B1 | 3/2001 | Burnell-Jones |
| 6,221,769 | B1 | 4/2001 | Dhong et al. |
| 6,242,078 | B1 | 6/2001 | Pommer et al. |
| 6,262,579 | B1 | 7/2001 | Chazan et al. |
| 6,310,391 | B1 | 10/2001 | Nagasawa et al. |
| 6,329,610 | B1 | 12/2001 | Takubo et al. |
| 6,353,501 | B1 | 3/2002 | Woodruff et al. |
| 6,372,992 | B1 | 4/2002 | Yang |
| 6,576,998 | B1 | 6/2003 | Hoffman |
| 6,764,748 | B1 | 7/2004 | Farquhar et al. |
| 6,998,327 | B2 | 2/2006 | Danielson et al. |
| 7,916,492 | B1 | 3/2011 | Zhong et al. |
| 7,951,663 | B2 * | 5/2011 | Lin .............................. 438/238 |
| 2001/0010367 | A1 | 8/2001 | Burnell-Jones |
| 2001/0024839 | A1 | 9/2001 | Lin |
| 2001/0042637 | A1 | 11/2001 | Hirose et al. |
| 2002/0005591 | A1 | 1/2002 | Lin |
| 2002/0075203 | A1 | 6/2002 | Woodruff et al. |
| 2003/0055179 | A1 | 3/2003 | Ota et al. |
| 2003/0085383 | A1 | 5/2003 | Burnell-Jones |
| 2003/0164541 | A1 | 9/2003 | Lee |
| 2003/0214461 | A9 | 11/2003 | Woodruff et al. |
| 2004/0025333 | A1 | 2/2004 | Hirose et al. |
| 2004/0105989 | A1 | 6/2004 | Ohta et al. |
| 2004/0182509 | A1 | 9/2004 | Farquhar et al. |
| 2004/0197952 | A1 | 10/2004 | Lee |
| 2005/0067686 | A1 | 3/2005 | Usui et al. |
| 2005/0112798 | A1 | 5/2005 | Bjorbell |
| 2005/0140026 | A1 | 6/2005 | Salmon |
| 2006/0060956 | A1 | 3/2006 | Tanikella |
| 2006/0068576 | A1 | 3/2006 | Burdick, Jr. et al. |
| 2006/0102384 | A1 | 5/2006 | Watanabe et al. |
| 2006/0220244 | A1 | 10/2006 | Lu et al. |
| 2007/0025092 | A1 | 2/2007 | Lee et al. |
| 2007/0062722 | A1 | 3/2007 | Tanaka et al. |
| 2007/0096328 | A1 | 5/2007 | Takahashi et al. |
| 2008/0041615 | A1 | 2/2008 | Zhong et al. |
| 2008/0061437 | A1 | 3/2008 | Kohara et al. |
| 2008/0087986 | A1 | 4/2008 | Tanikella |
| 2008/0173473 | A1 | 7/2008 | Hirose et al. |
| 2008/0189943 | A1 | 8/2008 | Hirose et al. |
| 2009/0084595 | A1 | 4/2009 | Park et al. |
| 2009/0212443 | A1 | 8/2009 | Zhong |
| 2009/0218125 | A1 | 9/2009 | Nakai et al. |
| 2009/0250253 | A1 | 10/2009 | Park et al. |
| 2009/0250811 | A1 | 10/2009 | Pendse |
| 2009/0255111 | A1 | 10/2009 | Takahashi et al. |
| 2010/0000087 | A1 | 1/2010 | Watanabe et al. |
| 2010/0065105 | A1 | 3/2010 | Koran et al. |
| 2010/0066683 | A1 | 3/2010 | Chang et al. |
| 2010/0078212 | A1 | 4/2010 | Komatsu |
| 2010/0117245 | A1 | 5/2010 | Zhong |
| 2010/0122839 | A1 | 5/2010 | Akai et al. |
| 2010/0163288 | A1 | 7/2010 | Zhong et al. |
| 2010/0252318 | A1 | 10/2010 | Takahashi et al. |
| 2011/0091697 | A1 | 4/2011 | Tseng et al. |
| 2011/0189848 | A1 | 8/2011 | Ewert et al. |
| 2012/0077401 | A1 | 3/2012 | Kotake et al. |

FOREIGN PATENT DOCUMENTS

| | | |
|---|---|---|
| EP | 2237652 | 10/2010 |
| WO | 2008102692 | 8/2008 |

OTHER PUBLICATIONS

Narayan et al., "Thin Film Transfer Process for Low Cost MCM's", IEEE/CHMT Int'l Electronics Manufacturing Technology Symposium, 1993, pp. 373-380.

Zhang et al., "The Processing and Assembly of Liquid Crystalline Polymer Printed Circuits," 2002 Int. Symposium on Microelectronics, 2002, pp. 1-9.

Drawings TopLine BGa SMD and NSMD Land Pattern, Oct. 2010, pp. 1-4.

I-CONNECT007, "When Will That Elusive Liquid Crystal Film Polymer Market Break into the Big Time?", Source: http://www.pcb007.com/pages/zone.cgi?a=18632&z=2&v=&_pf_=1, Jan. 2008, pp. 1-4.

Zhang et al., "Flexible Electronics: Thin Silicon Die on Flexible Substrates", IEEE Transactions on Electronics Packaging Manufacturing, vol. 32, No. 4, Oct. 2009, pp. 291-300.

* cited by examiner

US 9,059,317 B2

METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES

FIELD OF THE INVENTION

The present invention relates to the field of electronic device fabrication and, more particularly, to an electronic device with a rigid silicon substrate and a liquid crystal polymer solder mask, and related methods.

BACKGROUND OF THE INVENTION

As semiconductor and integrated circuit technology has advanced, there has been a trend toward high-functionality integrated circuit components with numerous input and output (I/O) pins. Consequently, as integrated circuits get smaller, they increasingly have smaller I/O pads arranged more closely together than ever before.

To match these integrated circuits, there is a demand for printed wiring boards (PWBs) to match the footprint of these integrated circuits with closely arranged solder pads. However, the miniaturization of the spacing between the pads on the IC is currently happening at a greater rate than the miniaturization of solder pads on printed circuit boards. Consequently, there is an interconnection technology gap for some modern devices.

To make such devices function, PWBs may require extra routing layers to attach to the pads of the integrated circuits, or utilize fan-out packaging. This results in the package size of an integrated circuit being larger than the integrated circuit itself, which may limit system miniaturization. As such, additional methods of connecting integrated circuits to printed circuit boards are needed.

SUMMARY OF THE INVENTION

In view of the foregoing background, it is therefore an object of the present invention to provide a method of making an electronic device having a thin liquid crystal polymer (LCP) solder mask.

This and other objects, features, and advantages in accordance with the present invention are provided by a method of making an electronic device that includes forming an interconnect layer stack on a rigid wafer substrate, the interconnect layer stack comprising a plurality of patterned electrical conductor layers separated by a dielectric layer between adjacent patterned electrical conductor layers, and a solder pad at an uppermost patterned electrical conductor layer. The method also includes forming an LCP solder mask having an aperture therein alignable with the solder pad.

The method further includes aligning and laminating the LCP solder mask and the interconnect layer stack together, and positioning solder in the aperture. Further, the method includes attaching at least one circuit component to the solder pad using the solder. It should be appreciated that the LCP solder mask is not limited to use as a mask for solder only, and may be used for other methods of attaching the at least one circuit component to the solder pad. For example, in some embodiments, the at least one circuit component may be attached to the solder pad using other techniques, such as through the use of a conductive epoxy or the formation of intermetallic bonds.

This method presents numerous advantages, including but not limited to the creation of a thinner electronic device than the prior art, and the ability to effectively attach an electronic component to an array of solder pads having a finer pitch than the prior art. Attaching the circuit component may be accomplished by heating the solder, and the solder may be positioned in the apertures defined by the LCP solder mask by dipping the electronic device in a solder bath. Additionally or alternatively, the solder may be positioned in the apertures by depositing solder paste in the apertures.

Laminating the LCP solder mask and the interconnect layer stack together may be performed by applying heat and pressure to the LCP solder mask and the interconnect layer stack preferably in an autoclave.

Forming the LCP solder mask may be accomplished by punching or laser milling the apertures.

Forming the plurality of patterned conductor layers can be accomplished by conventional thin film deposition methodologies.

The at least one circuit component may comprise at least one integrated circuit. In addition, the LCP solder mask may have a thickness of less than 0.0015 inches. Further, the semiconductor layer may comprise an integrated circuit die.

A device aspect is directed to a device comprising a semiconductor layer, and that includes an interconnect layer stack on the semiconductor layer. The layer stack is made of a plurality of patterned electrical conductor layers, a dielectric layer between adjacent patterned electrical conductor layers, and a solder pad on an uppermost patterned electrical conductor layer. There is a LCP solder mask on the uppermost layer of the plurality of patterned electrical conductor layers and has an aperture aligned with the solder pads. In addition, there is also a fused seam between the interconnect layer stack and the LCP solder mask. Solder is disposed in the apertures, and a circuit component is electrically coupled to the solder pad via the solder.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
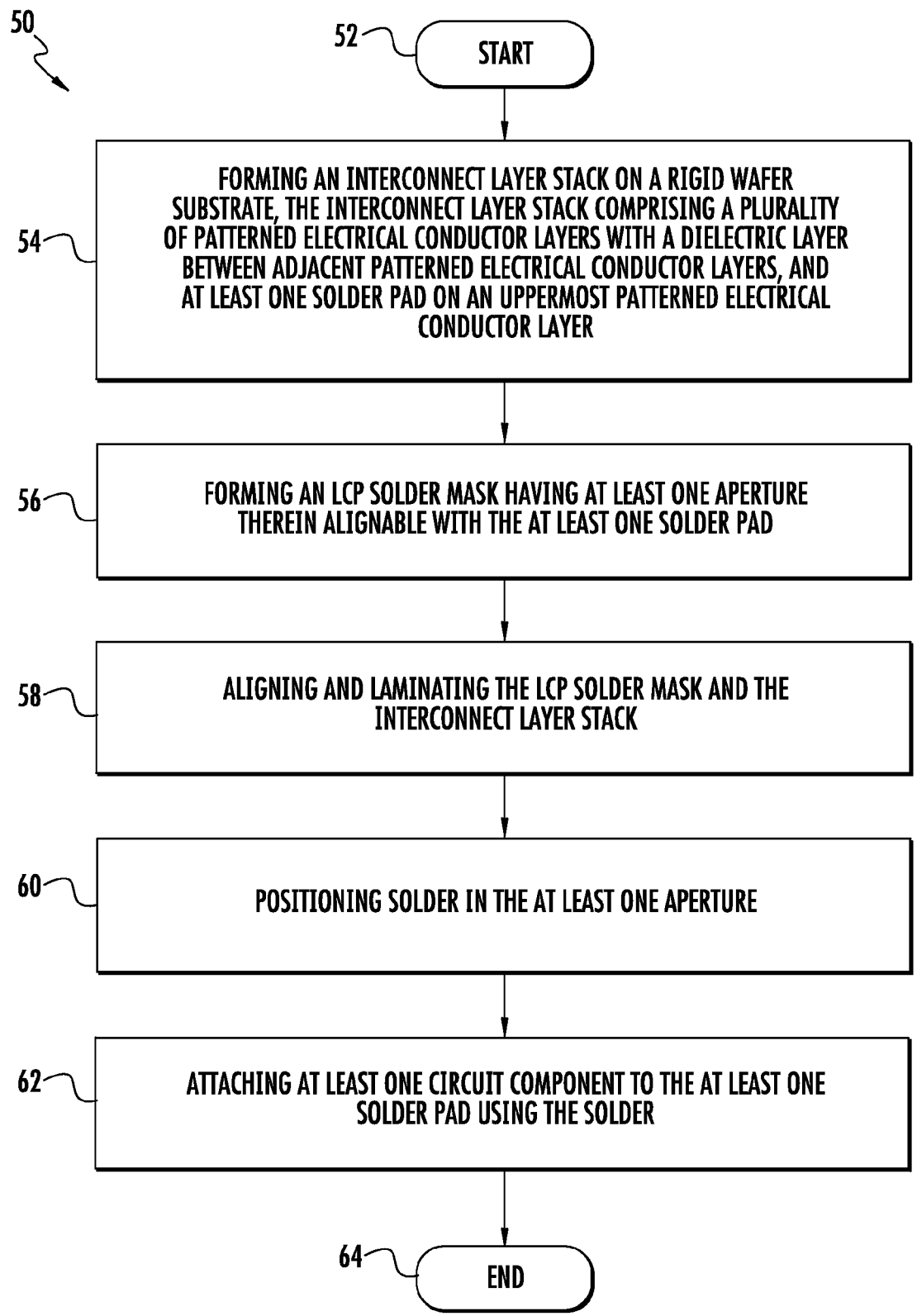
FIG. 1 is a flowchart of a method of making an electronic device according to the present invention.
Figure 2A:
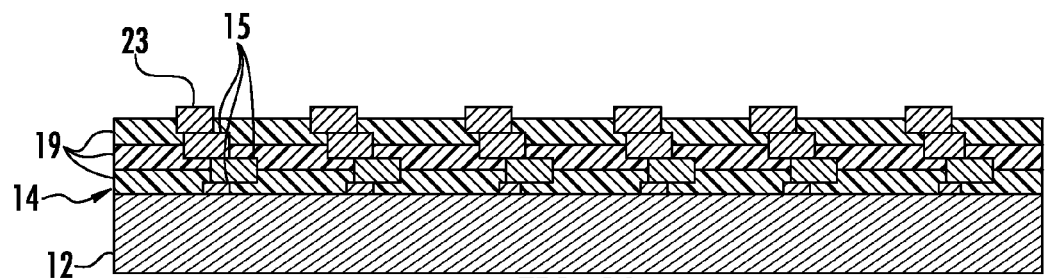
FIG. 2A-2F are sequential schematic cross sectional views of an electronic device of the present invention.

Referring initially to the flowchart 50 of FIG. 1, and FIGS. 2A-2F, a method of making an electronic device is now described. After the start (Block 52), as shown in FIG. 2A, an interconnect layer stack 14 including a plurality of patterned electrical conductor layers 15, with dielectric layers 19 between adjacent patterned electrical conductor layers is formed on a rigid wafer substrate 12. Subsequently, at least one solder pad 23 is formed on the outermost patterned electrical layer with the entire layer stack arranged on the rigid wafer substrate 12 (at Block 54). The solder pads 23 are typically formed from copper, and may be 0.006" or less in diameter. Of course, the solder pads 23 may also have other diameters in some applications.

Figure 2B:
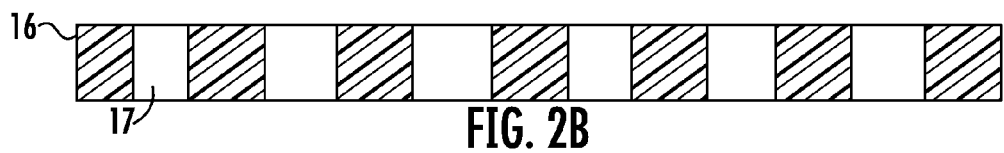
Figure 2C:
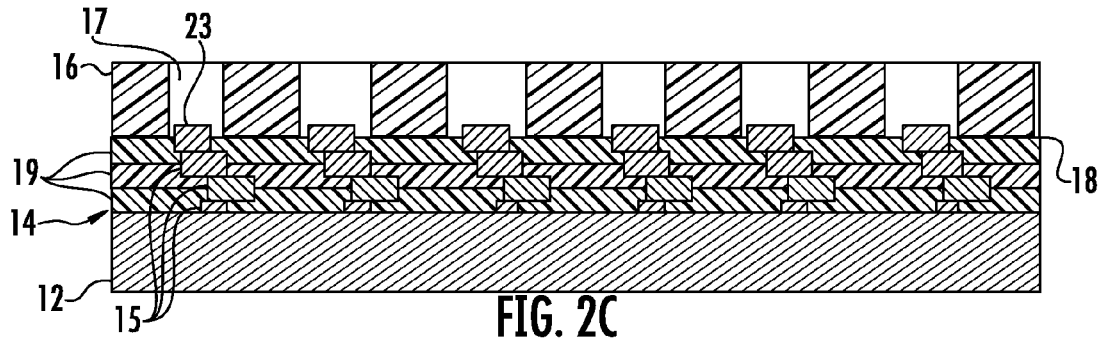

Next, as shown in FIG. 2B, a LCP solder mask 16 having at least one aperture 17 therein alignable with the at least one solder pad 23 is formed (Block 56). The apertures 17 may be as small as 0.001 inch to 0.002 inches, or larger, for example. The LCP solder mask 16 and interconnect layer stack 14 are then laminated together (Block 58), as shown in FIG. 2C. By "alignment" it is meant that the solder pads 23 are contained within the apertures and are accessible for use in dispensing solder and attaching an electronic component. This alignment may be performed by first using a fixture or guide to roughly align the LCP solder mask 16 and the interconnect layer stack 14, and then finely adjusting the alignment under a microscope to reach the final alignment. This method advantageously allows a positional accuracy of alignment in the range of 0.0005 inches to 0.001 inches.

LCP is a particularly advantageous material from which to form solder masks for a variety of reasons, including the fact that it has a high tensile strength, providing a high resistance to abrasion and damage. Typically, LCP also has a high chemical resistance, inherent flame retardancy, and good weatherability. LCP resists stress cracking in the presence of most chemicals at elevated temperatures, including aromatic or halogenated hydrocarbons, strong acids, bases, ketones, and other aggressive industrial substances. Those skilled in the art should understand that there are a variety of LCPs that may be used in the production of electronic devices according to the present invention.

The use of LCP to construct the solder mask 16 results in a solder mask that is thinner than some prior art solder masks, for example 0.001 inch thick as opposed to 0.002+ inches thick. This allows for solder mask protection of ball grid arrays down to a 0.008" pitch, advantageously allowing the attachment of integrated circuits with a narrow spacing between pads to a substrate or printed circuit board without increasing the size of the overall package beyond the size of the integrated circuit itself.

In addition, the LCP solder mask 16 exhibits a superior thickness uniformity as compared to some prior art solder masks. Further, the LCP solder mask 16 provides a better electrical isolation than conventional solder masks, having a dielectric strength of approximately 3500 volts per mil, as opposed to the 500 volts per mil of the conventional solder masks. Furthermore, the LCP solder mask 16 seals against the interconnect layer stack 14, protecting it from outside contaminants and protecting the underlying wafer substrate from moisture degradation since LCP forms a near-hermetic material.

Figure 2D:
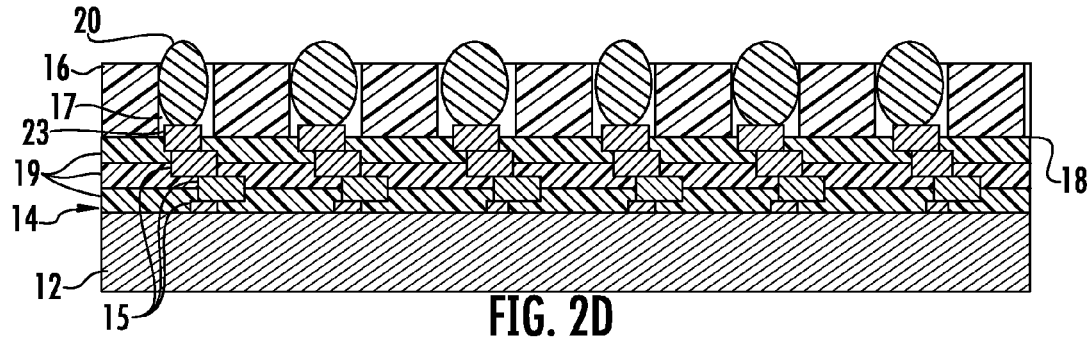
Figure 2E:
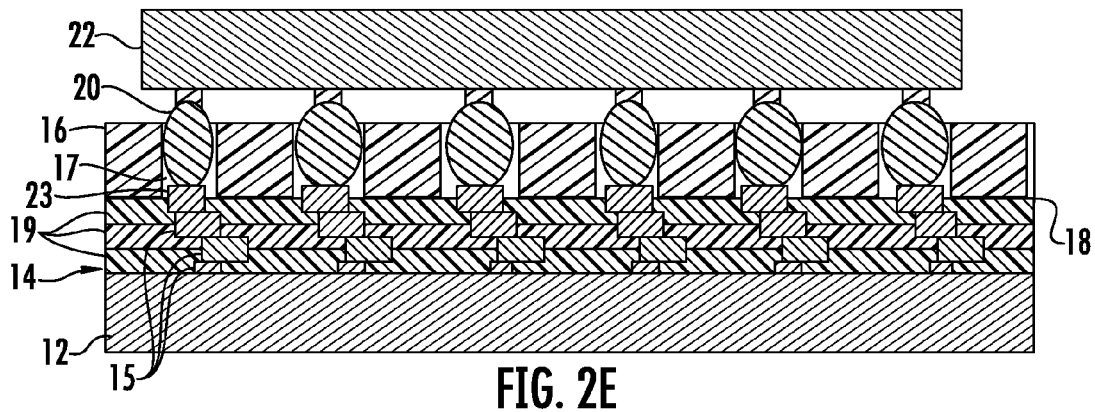

Solder 20 is then positioned in the apertures 17 (Block 60), as shown in FIG. 2D. A circuit component, such as an integrated circuit 22, is then positioned over the solder mask 16 such that the pads thereof contact the solder 20, and are attached thereto using the solder (Block 62), as shown in FIG. 2E. Block 64 indicates the end of the method.

A more detailed method of making an electronic device in accordance with the present is now described with reference to the flowchart 50' of FIG. 3, and also with reference to FIGS. 2A-2F. After the start (Block 52'), the interconnect layer stack 14 is formed on a rigid wafer substrate 12 (Block 54'). Here, the interconnect layer stack 14 includes a plurality of solder pads 23 arranged in an array pattern. In addition, the interconnect layer stack 14, including the patterned electrical conductor layers 15, are formed by conventional thin film deposition methodologies. It should be understood that other methods of forming the interconnect layer stack 14 may also be employed.

Next, the method includes punching and/or laser milling at least one aperture 17 alignable with at least one solder pad 23 of the plurality thereof in the LCP solder mask 16, which has a thickness of less than 0.0015 inch (Block 56'). The LCP solder mask 16 and the interconnect layer stack 14 are then aligned and laminated together via the application of heat and pressure in an autoclave (Block 58'). An autoclave advantageously provides isostatic pressure (i.e. equal pressure from all directions), and helps to keep the LCP from deforming during the lamination process. While the use of an autoclave for lamination is preferred, a press (possible in an inert atmosphere or vacuum bag) may also be used to perform the lamination.

Solder 20 is positioned in the apertures 17 by dipping the device in a solder bath (for example, at 240° C. and for a duration of 5 seconds) or by positioning or depositing solder paste or conductive epoxy in the apertures via a squeegee (Block 60'). The solder does not wet to the LCP solder mask 16. The integrated circuit 22 is then attached to the solder pads 23 by heating the solder 20, which then melts and re-solidifies (Block 62'). Block 64' indicates the end of the method.

Figure 2F:
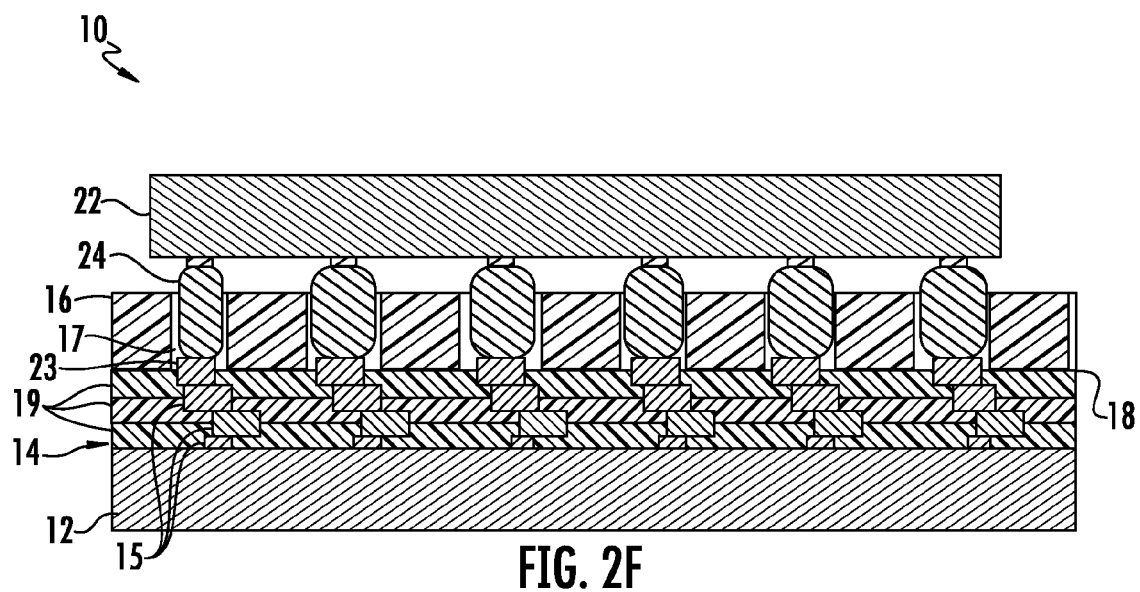
Figure 3:
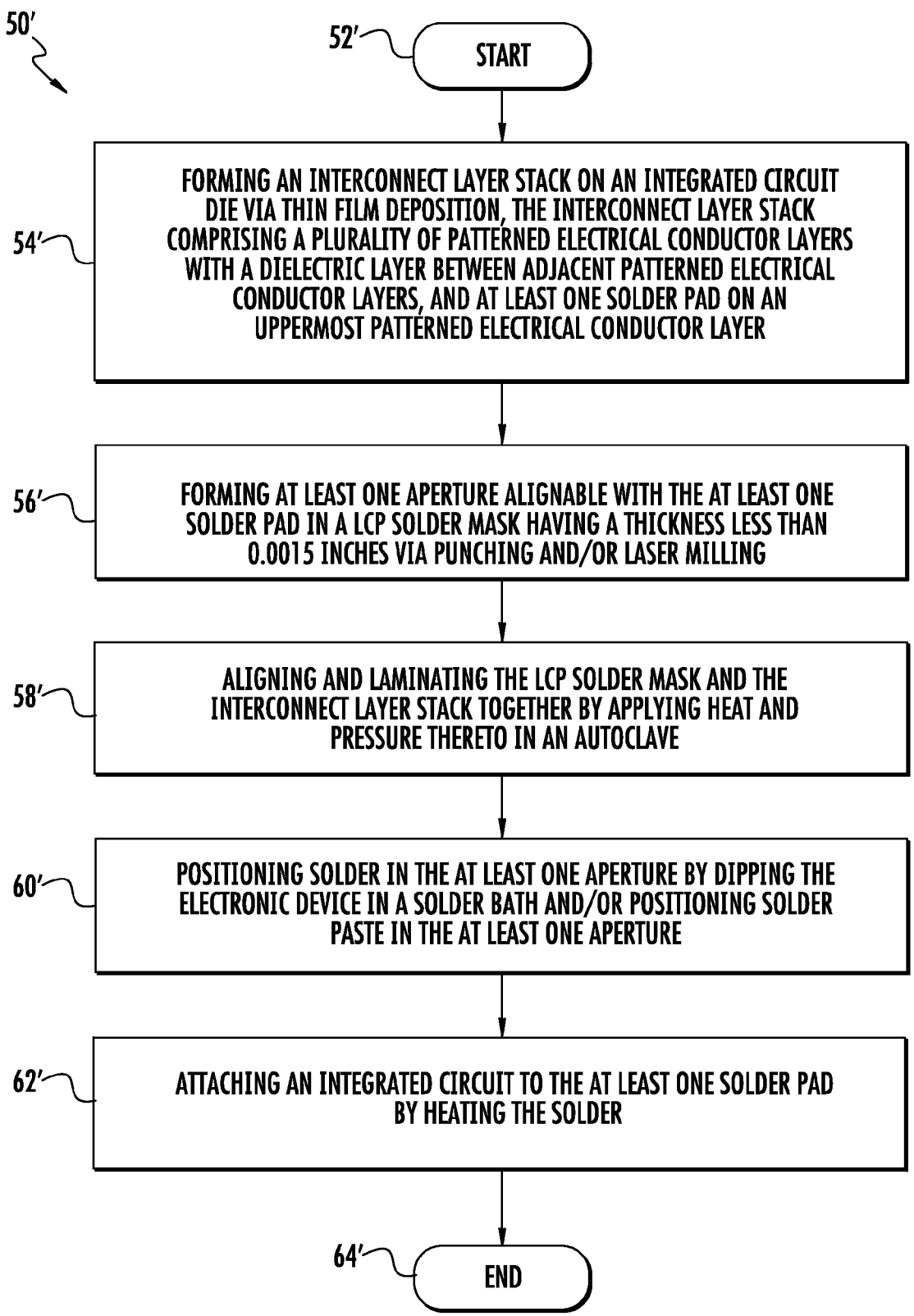
FIG. 3 is a flowchart of a more detailed method of making an electronic device according to the present invention.

The completed electronic device 10 is shown in FIG. 2F. The electronic device 10 comprises the rigid wafer substrate 12, with an interconnect layer stack 14 on the rigid wafer substrate that includes a plurality of patterned electrical conductor layers 15, a dielectric layer 19 between adjacent patterned electrical conductor layers, and at least one solder pad 23 at an uppermost layer of the plurality of patterned electrical conductor layers. The LCP solder mask 16 is on the interconnect layer stack 14, and the solder mask has at least one aperture 17 aligned with the at least one solder pad 23. There is a fused seam 18 between the LCP solder mask 16 and the interconnect layer stack 14. This fused seam 18 is formed during the melting and joining of the LCP solder mask 16 and the interconnect layer stack 14, and is readily visible in a photograph of a cross sectioned device.

Solder 24 (illustratively melted solder) is in the apertures 17, although it should be appreciated that instead of solder a conductive polymeric adhesive may be used. An integrated circuit 22 is electrically coupled to the solder pads 23 via the solder 24.

Other details of methods for making an electronic device 10 may be found in co-pending applications METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES, U.S. Publication No. 2012/0182701 published Jul. 19, 2012 and METHOD OF MAKING AN ELECTRONIC DEVICE HAVING A LIQUID CRYSTAL POLYMER SOLDER MASK AND RELATED DEVICES, U.S. Publication No. 2012/0182702 published Jul. 19, 2012 and ELECTRONIC DEVICE HAVING LIQUID CRYSTAL POLYMER SOLDER MASK AND OUTER SEALING LAYERS, AND ASSOCIATED METHODS, U.S. Pat. No. 8,472,207 issued Jun. 25, 2013, the entire disclosures of which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:
    forming an interconnect layer stack on a rigid wafer substrate and comprising a plurality of patterned electrical conductor layers with dielectric layers between adjacent patterned electrical conductor layers, and at least one solder pad on an uppermost patterned electrical conductor layer;
    forming an LCP solder mask separate from the interconnect layer stack and having at least one aperture therein alignable with the at least one solder pad;
    aligning the LCP solder mask and interconnect layer stack so that the at least one aperture is aligned with the at least one solder pad;
    aligning and laminating the LCP solder mask and the interconnect layer stack together by applying heat and pressure to the LCP solder mask and the uppermost layer of the plurality of circuit layers;
    positioning a conductive material in the at least one aperture by dipping the electronic device in a solder bath; and
    attaching at least one circuit component to the at least one solder pad using the solder conductive material.

2. The method of claim 1, wherein the conductive material comprises solder; and wherein attaching the at least one circuit component comprises heating the solder.

3. The method of claim 1, wherein the conductive material comprises epoxy; and wherein attaching the at least one circuit component comprises heating the epoxy.

4. The method of claim 1, wherein applying heat and pressure is performed in an autoclave.

5. The method of claim 1, wherein forming the LCP solder mask comprises at least one of punching and laser milling the at least one aperture.

6. The method of claim 1, wherein forming the interconnect layer stack comprises forming the plurality of patterned electrical conductor layers using conventional thin film deposition.

7. The method of claim 1, wherein the at least one circuit component comprises at least one integrated circuit.

8. The method of claim 1, wherein the LCP solder mask has a thickness of less than 0.0015 inches.

9. An electronic device comprising:
    a semiconductor layer;
    an interconnect layer stack on said rigid wafer substrate semiconductor layer and comprising a plurality of patterned electrical conductor layers, a dielectric layer between adjacent patterned electrical conductor layers, and at least one solder pad on an uppermost patterned electrical conductor layer;
    an LCP solder mask on said interconnect layer stack and having at least one aperture aligned with said at least one solder pad;
    a fused seam between said interconnect layer stack and said LCP solder mask;
    a conductive material in the at least one aperture; and
    at least one circuit component electrically coupled to said at least one solder pad through said solder conductive material.

10. The electronic device of claim 9, wherein the conductive material comprises solder.

11. The electronic device of claim 9, wherein the conductive material comprises epoxy.

12. The electronic device of claim 9, wherein said at least one solder pad comprises a plurality thereof arranged in an array pattern.

13. The electronic device of claim 9, wherein said at least one circuit component comprises at least one integrated circuit.

14. The electronic device of claim 9, wherein said LCP solder mask has a thickness of less than 0.0015 inches.

15. A method of making an electronic device comprising:
    forming an interconnect layer stack on a substrate and comprising a plurality of patterned electrical conductor layers with dielectric layers between adjacent patterned electrical conductor layers, and at least one solder pad on an uppermost patterned electrical conductor layer;
    forming an LCP solder mask separate from the interconnect layer stack and having at least one aperture therein;
    aligning the LCP solder mask and interconnect layer stack so that the at least one aperture is aligned with the at least one solder pad;
    laminating the LCP solder mask and the interconnect layer stack together; and
    attaching at least one circuit component to the at least one solder pad using a conductive material positioned in the at least one aperture.

16. The method of claim 15, wherein the conductive material comprises solder; and wherein attaching the at least one circuit component comprises heating the solder.

17. The method of claim 15, wherein the conductive material comprises epoxy; and wherein attaching the at least one circuit component comprises heating the epoxy.

18. The method of claim 15, wherein laminating comprises applying heat and pressure in an autoclave.

19. The method of claim 15, wherein forming the LCP solder mask comprises at least one of punching and laser milling the at least one aperture.

20. The method of claim 15, wherein forming the interconnect layer stack comprises forming the plurality of patterned electrical conductor layers using thin film deposition.

21. The method of claim 15, wherein the at least one circuit component comprises at least one integrated circuit.

22. The method of claim 15, wherein the LCP solder mask has a thickness of less than 0.0015 inches.

* * * * *